US 9,281,804 B2

(12) United States Patent
Iwabuchi

(10) Patent No.: US 9,281,804 B2
(45) Date of Patent: Mar. 8, 2016

(54) SEMICONDUCTOR DEVICE WITH AMPLIFICATION CIRCUIT AND OUTPUT BUFFER CIRCUIT COUPLED TO TERMINAL

(71) Applicant: Renesas Electronics Corporation, Kawasaki-shi, Kanagawa (JP)

(72) Inventor: Masaru Iwabuchi, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/024,619

(22) Filed: Sep. 11, 2013

(65) Prior Publication Data

US 2014/0070851 A1 Mar. 13, 2014

(30) Foreign Application Priority Data

Sep. 12, 2012 (JP) .................................. 2012-200474

(51) Int. Cl.
| | |
|---|---|
| *H03K 3/01* | (2006.01) |
| *H03K 3/011* | (2006.01) |
| *H03K 19/00* | (2006.01) |
| *H03K 19/003* | (2006.01) |

(52) U.S. Cl.
CPC .................. *H03K 3/01* (2013.01); *H03K 3/011* (2013.01); *H03K 19/0013* (2013.01); *H03K 19/00361* (2013.01)

(58) Field of Classification Search
CPC ............ H01L 27/14603; H01L 27/124; H01L 27/1225; H03K 19/017509; H03K 19/017545; H03K 3/356; H03K 3/037
USPC ................................... 327/108, 109, 110, 112
See application file for complete search history.

(56) References Cited

U.S. PATENT DOCUMENTS

| 5,113,156 A | * | 5/1992 | Mahabadi et al. ............. 331/109 |
| 5,708,608 A | * | 1/1998 | Park et al. ................. 365/189.05 |
| 6,933,797 B2 | | 8/2005 | Miyahara et al. |
| 7,023,247 B2 | | 4/2006 | Nii |

(Continued)

FOREIGN PATENT DOCUMENTS

| JP | 56-165408 A | 12/1981 |
| JP | 4-169983 A | 6/1992 |

(Continued)

OTHER PUBLICATIONS

Office Action issued Oct. 6, 2015, in Japanese Patent Application No. 2012-200474.

*Primary Examiner* — John Poos
(74) *Attorney, Agent, or Firm* — Shapiro, Gabor and Rosenberger, PLLC

(57) ABSTRACT

The present invention is directed to solve a problem that, in a semiconductor device capable of generating a clock signal by coupling a quartz oscillator to an external terminal to which an I/O port is coupled, leak current of the I/O port which is in the inactive state disturbs activation of a clock. The semiconductor device has a first terminal, an amplification circuit coupled to the first terminal, and an output buffer whose output terminal is coupled to the first terminal. The output buffer has first and second transistors of a first conduction type coupled in series via a first node between a first power supply line and an output terminal, and the conduction states of the first and second transistors of the first conduction state are controlled in response to a first control signal which is applied commonly to the gate of each of the first and second transistors.

14 Claims, 7 Drawing Sheets

(56) References Cited

U.S. PATENT DOCUMENTS

| | | | |
|---|---|---|---|
| 8,217,726 B2 | 7/2012 | Sako et al. | |
| 8,390,560 B2 | 3/2013 | Toyoshima et al. | |
| 2003/0210080 A1* | 11/2003 | Xi | 327/108 |
| 2009/0160496 A1* | 6/2009 | Takeuchi | 327/108 |
| 2009/0261866 A1* | 10/2009 | Shibata | 327/108 |

FOREIGN PATENT DOCUMENTS

| | | |
|---|---|---|
| JP | 2004-96711 A | 3/2004 |
| JP | 2004-104754 A | 4/2004 |
| JP | 2011-71841 A | 4/2011 |
| JP | 2011-139309 A | 7/2011 |

\* cited by examiner

SEMICONDUCTOR DEVICE WITH AMPLIFICATION CIRCUIT AND OUTPUT BUFFER CIRCUIT COUPLED TO TERMINAL

CROSS-REFERENCE TO RELATED APPLICATIONS

The disclosure of Japanese Patent Application No. 2012-200474 filed on Sep. 12, 2012 including the specification, drawings and abstract is incorporated herein by reference in its entirety.

BACKGROUND

The present invention relates to a semiconductor device and, more specifically, a semiconductor device having an output transistor using low leak current.

There is a known configuration of generating a clock signal to be supplied to a real-time clock by a quartz oscillation circuit comprised of an amplification circuit provided in a microcomputer and a quartz oscillator coupled to an external terminal of the microcomputer. On the other hand, in the case where a quartz oscillator is not coupled to an external terminal due to limitation of the number of external terminals of a microcomputer (in the case where the function of a real-time clock is unnecessary), it is desired to use the external terminal also as an input/output terminal of an I/O port.

In the case where a quartz oscillator is coupled to an external terminal, the influence of an I/O port formed in the microcomputer is a concern. In this case, input/output buffers as components of the I/O port are inactive (in a high-impedance (H-Z) state). There is a concern that leak current of the output buffer disturbs normal operation of the quartz oscillation circuit. Japanese Unexamined Patent Publication No. 2004-104759 (patent literature 1) discloses the configuration of a semiconductor device in which gate leak current of a driver circuit having a transistor whose gate oxide film is thin is suppressed. In the case of holding a conductive state of an output transistor coupled to an output terminal, by making on voltage which is applied across the source and the gate of the output transistor lower than power source voltage, gate leak current is suppressed.

PATENT LITERATURE

Patent Literature 1: Japanese Unexamined Patent Publication No. 2009-104754

SUMMARY

Although the patent literature 1 discloses the configuration of suppressing the gate leak current of the transistor in the conductive state, it does not disclose a configuration of suppressing leak current between the source and the drain of the transistor which is in an inactive state. Therefore, the influence exerted on the quartz oscillation circuit, of the leak current of the output buffer as a component of the I/O port which is made inactive cannot be suppressed. The above object and novel features will become apparent from the description of the specification and the attached drawings.

According to an embodiment, a semiconductor device includes a first terminal, an amplification circuit coupled to the first terminal, and an output buffer whose output terminal is coupled to the first terminal. The output buffer has a first transistor of a first conduction type whose source and drain are coupled to a first power supply line and a first node, respectively, and a second transistor of the first conduction type whose source and drain are coupled to the first node and the output terminal, respectively, and the conduction states of the first and second transistors are controlled in response to a first control signal which is applied commonly to the gate of each of the first and second transistors.

According to the embodiment, a clock can be generated stably without being influenced by leak current of the output buffer.

DETAILED DESCRIPTION

Figure 1:
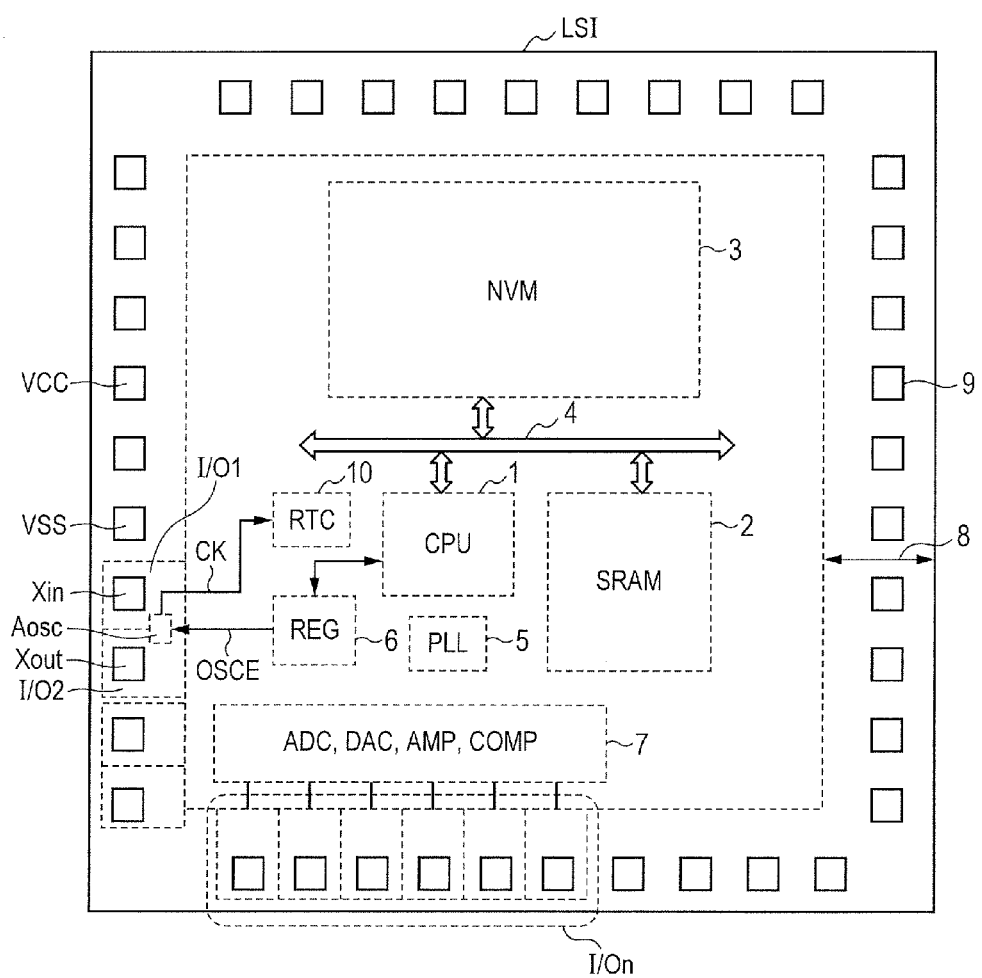
FIG. 1 is a block diagram illustrating the configuration of a semiconductor device according to a first embodiment.

Hereinafter, embodiments will be described with reference to the drawings. In the case of referring to number, quantity, and the like in the explanation of the embodiments, unless otherwise described, the present invention is not limited to the number, quantity, and the like. The same reference signs and reference numerals express the same parts or corresponding parts in the drawings of the embodiments. In the explanation of the embodiments, there is a case that description on parts to which the same reference sign or the like is assigned will not be repeated.

First Embodiment

With reference to FIG. 1, the configuration of a semiconductor device LSI according to a first embodiment will be described.

A semiconductor device LSI is a microcomputer comprised of an integrated circuit formed on a single semiconductor substrate and has a CPU (Central Processing Unit) 1, an SRAM (Static Random Access Memory) 2, an NVM (rewritable nonvolatile memory such as a flash memory) 3, an internal bus 4, a PLL (Phase-Locked Loop circuit) 5, an REG (register) 6, an interface circuit 7 and a real-time clock 10. In a peripheral region 8 of the semiconductor device LSI, a plurality of external terminals 9 (disposed in the peripheral region 8 and including other plural square patterns to which reference numerals are not designated), and an I/O port part I/On having a plurality of I/O ports coupled to the external terminals 9 are disposed. To power supply terminals VCC and VSS, power supply voltages VCC and VSS (which also denote corresponding power supply voltages in the specification) are supplied, respectively. The power supply voltage VSS is, for example, 0V, and the power supply voltage VCC is a positive voltage adapted to the operation of the semiconductor device LSI.

The internal bus 4 is a bus coupling the CPU 1, the SRAM 2, and the NVM 3 and is used when the CPU 1 accesses the SRAM 3 and the NVM 3. The PLL 5 generates an operation clock of the microcomputer and supplies the operation clock to function units such as the CPU 1. The interface circuit 7 receives/outputs signals from/to the I/O port part I/On and the function units in the semiconductor device LSI.

Specifically, the interface circuit 7 has an analog-to-digital converter ADC for converting an analog signal supplied from the outside to a digital signal, a digital-to-analog converter DAC for converting a digital signal generated in the semiconductor device LSI to an analog signal and outputting the analog signal to the outside of the semiconductor device LSI, an amplifier AMP for amplifying the analog signal which is received from the outside (or the inside) of the semiconductor device and supplying the amplified signal to the inside (or the outside) of the semiconductor device LSI, and a comparator COMP which compares the voltage value of the analog signal received from the outside of the semiconductor device LSI with a predetermined level.

Hereinafter, the analog-to-digital converter ADC, the digital-to-analog converter DAC, the amplifier AMP, and the comparator COMP will be collectively called analog circuits. The analog circuits commonly use the I/O port part I/On and the external terminals 9. Whether the plurality of external terminals 9 coupled to the interface circuit 7 are used as input/output terminals of the I/O port part I/On or as input/output terminals of the analog circuits are set by the user via the CPU 1.

The semiconductor device LSI further includes an external terminal Xin, an external terminal Xout, I/O ports I/O1 and I/O2, and an amplification circuit Aosc. The user of the semiconductor device LSI determines necessity of coupling of a quartz oscillator between the external terminals Xin and Xout in accordance with the necessity of the function of the real-time clock 10. In the case where a quartz oscillator is coupled between the external terminals Xin and Xout, the amplification circuit Aosc generates a clock signal CK. The generated clock signal CK is supplied to the real-time clock 10. The real-time clock 10 has a counter circuit (not illustrated), counts the supplied clock signals, and times a signal indicative of the present date and time. In the case where no quartz oscillator is coupled between the external terminals Xin and Xout, the external terminals function as input/output terminals of the I/O ports I/O1 and I/O2.

According the purpose of use of the external terminals Xin and Xout, the user writes an operation set value defining the operation state of the amplification circuit Aosc into a predetermined region in the NVM 3. The operation set value is stored in the REG 6 via the internal bus 4 and the CPU 1 at the time of initialization when power is turned on in the semiconductor device LSI. In the case of coupling the quartz oscillator between the external terminals Xin and Xout, the amplification circuit Aosc is set to an active state by the operation set value. On the other hand, in the case where no quartz oscillator is coupled, the amplification circuit Aosc is set to an inactive state. Both of the operation states of the amplification circuit Aosc are controlled on the basis of a signal OSCE which is output from the REG 6 storing the operation set values.

Figure 2:
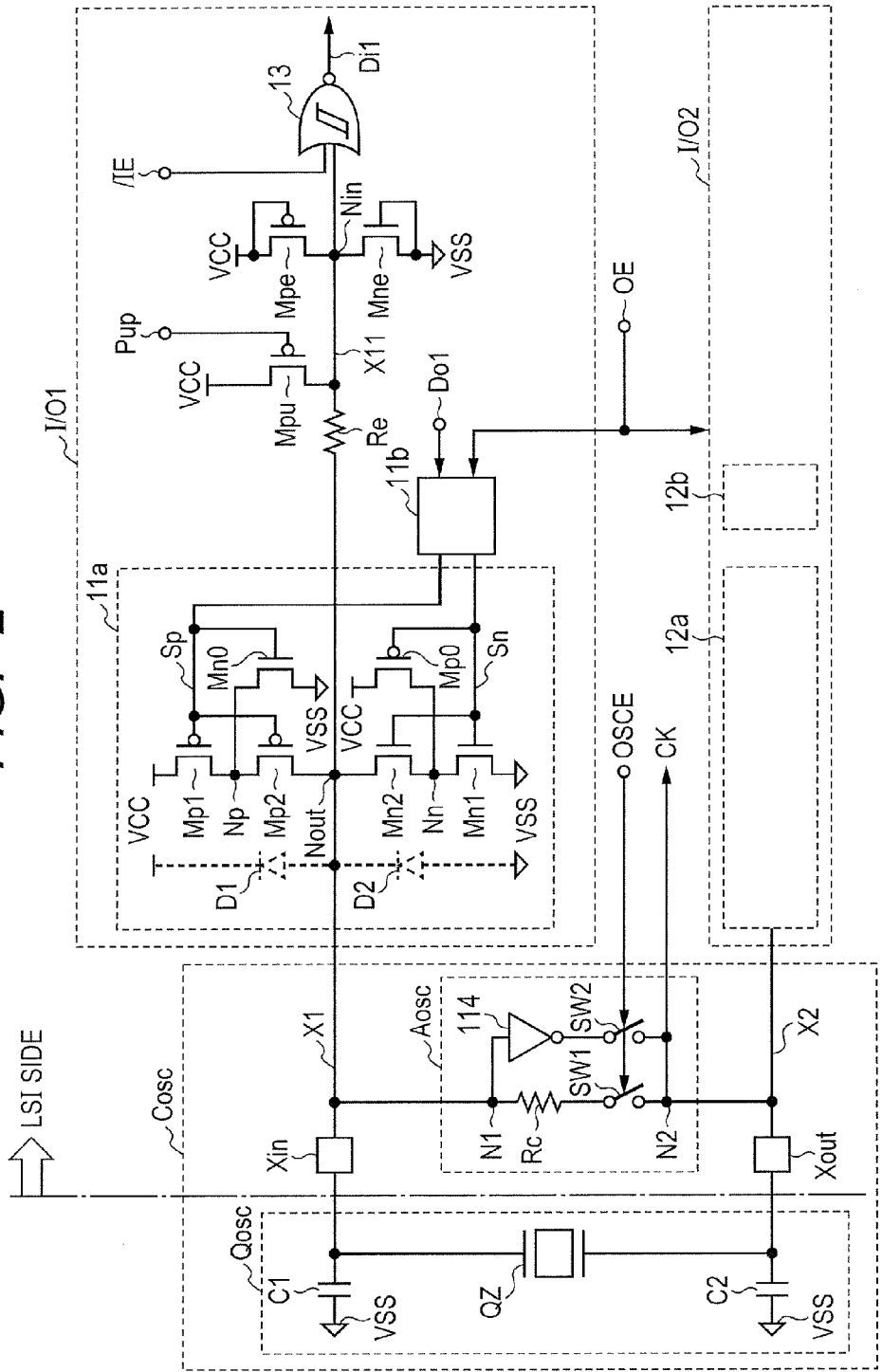
FIG. 2 is a circuit diagram of an I/O port and its peripheral circuits in the first embodiment.

With reference to FIG. 2, the circuit diagram of the I/O port I/O1 and its peripheral circuit in the first embodiment will be described.

The I/O port I/O1 is a three-state buffer and its state is controlled by a signal OE. The I/O port I/O1 has an output buffer rear-stage part 11a, an output buffer front-stage part 11b, an input buffer 13, a resistor Re, a p-type transistor Mpu, a p-type transistor Mpe, and an n-type transistor Mne. The transistors in the specification are MOSFETs (Metal-Oxide-Semiconductor Field-Effect Transistors).

The configuration and function of the output buffer rear-stage part 11a will be described. The output buffer rear-stage part 11a has p-type transistors Mp1 and Mp2 which increase an output node Nout to the high level (power supply voltage VCC). The source and drain of the p-type transistor Mp1 are coupled to the power supply line VCC and a node Np, respectively. The source and drain of the p-type transistor Mp2 are coupled to the node Np and the output node Nout, respectively. A signal Sp output from the output buffer front-stage part 11b is applied to each of the gates of the p-type transistors Mp1 and Mp2. When the signal Sp becomes the low level (power supply voltage VSS), both of the p-type transistors Mp1 and Mp2 enter a conductive state so that the voltage of the output node Nout is increased to the power supply voltage VCC.

The output buffer rear-stage part 11a further includes n-type transistors Mn1 and Mn2. The drain and source of the n-type transistor Mn1 are coupled to a node Nn the power supply line VSS, respectively. The drain and source of the n-type transistor Mn2 are coupled to the output node Nout and the node Nn, respectively. A signal Sn output from the output buffer front-stage part 11b is applied to each of the gates of the n-type transistors Mn1 and Mn2. When the signal Sn becomes the high level (power supply voltage VCC), both of the n-type transistors Mn1 and Mn2 enter a conductive state so that the voltage of the output node Nout is decreased to the power supply voltage VSS.

The output buffer rear-stage part 11a further includes an n-type transistor Mn0 and a p-type transistor Mp0. The n-type transistor Mn0 realizes an electric path between the node Np and the power supply line VSS. Concretely, the drain and source of the n-type transistor Mn0 are coupled to the node Np and the power supply line VSS, respectively, and the signal Sp output from the output buffer front-stage part 11b is applied to the gate of the n-type transistor Mn0. When the signal Sp becomes the high level, the p-type transistors Mp1 and Mp2 enters a non-conduction state, and the n-type transistor Mn0 becomes a conductive state. The p-type transistor Mp0 realizes an electric path between the node Nn and the power supply line VCC. The source and drain of the p-type transistor Mp0 are coupled to the power supply line VCC and the node Nn, and the signal Sn output from the output buffer front-stage part 11b is applied to the gate of the p-type transistor Mp0. When the signal Sn becomes the low level, the n-type transistors Mn1 and Mn2 enter a non-conduction state, and the p-type transistor Mp0 becomes a conductive state.

The output node Nout is coupled to a line X1. The line X1 is coupled to the external terminal Xin. The anode and the cathode of a diode D1 are coupled to the line X1 and the power supply line VCC, respectively. Further, the cathode and the anode of a diode D2 are coupled to the line X1 and the power supply line VSS, respectively. The diode D1 is a parasitic diode formed between the p-type drain and the n-well in the p-type transistor Mp2. The diode D2 is a parasitic diode formed between the n-type drain and the p-well in the n-type transistor Mn2. The two parasitic diodes operate as electrostatic protection elements and protect the output buffer rear-stage part 11a from surge voltage applied to the external terminal Xin.

The configuration and function of the output buffer front-stage part 11b will be described. The output buffer front-stage part 11b determines the voltage of the signals Sp and Sn on the basis of signal OE and Do1. In the case where the signal OE is at the high level, the voltages of the signals Sp and Sn are set on the basis of the signal Do1. In the case where the signal Do1 is at the low level, the signals Sp and Sn are set to the power supply voltage VCC. In the case where the signal Do1 is at the low level, the signals Sp and Sn are set to the power supply voltage VSS. As a result, in the case where the signal Do1 is at the low level, the output node Nout is decreased to the low level. In the case where the signal Do1 is at the high level, the output node Nout is increased to the high level. The signal Do1 is an output signal of a function block of the semiconductor device LSI of a not-illustrated interface circuit or the like.

In the case where the signal OE is at the low level, regardless of the value of the signal Do1, the signal Sp is set to the high level, and the signal Sn is set to the low level. As a result, all of the p-type transistors Mp1 and Mp2 and the n-type transistors Mn1 and Mn2 in the output buffer rear-stage part 11a are set to the non-conduction state. Consequently, the output buffer rear-stage part 11a is set in the inactive state (high-impedance state). That is, on the basis of the signal OE, the operation state of the output buffer of the I/O port I/O1 is set.

In the case where the output buffer rear-stage part 11a is in the inactive state, both of the n-type transistor Mn0 and the p-type transistor Mp0 are in the conductive state. Therefore, the voltage of the node Np is determined by the impedance of the p-type transistors Mp1 and Mp2 in the non-conduction state and the impedance of the n-type transistor Mn0 in the conductive state. Similarly, the voltage of the node Nn is determined by the impedance of the n-type transistors Mn1 and Mn2 in the non-conduction state and the impedance of the p-type transistor Mp0 in the conductive state.

The configuration and function of the input buffer 13 will be described. The input buffer 13 is configured by an OR circuit. In the first embodiment, to assure noise margin of an input signal, the input-output characteristic has a hysteresis characteristic. One end of a line X11 is coupled to one of input terminals of the input buffer 13. The other end of the line X11 is coupled to one end of the resistor Re, and the other end of the resistor Re is coupled to one end of the line X1. The other end of the line X1 is coupled to the external terminal Xin. The line X1 is further coupled to the output node Nout of the output buffer rear-stage part 11a.

The drain of the diode-coupled p-type transistor Mpe is coupled to the line X11 at an input node Nin. The source and gate of the p-type transistor Mpe are coupled to the power supply line VCC. The drain of the diode-coupled n-type transistor Mne is coupled to the line X11 at the input node Nin. The source and gate of the n-type transistor Mne are coupled to the power supply line VSS. The two transistors and the resistor Re are electrostatic protection elements and protect the input buffer 13 from the surge voltage applied to the external terminal Xin.

The source and drain of the p-type transistor Mpu are coupled to the power supply line VCC and the line X11, respectively, and a signal Pup is applied to the gate. A signal /IE is applied to the other input terminal of the input buffer 13. The input buffer 13 which is activated by the low-level signal /IE outputs a signal Di1 on the basis of the input signal applied to the external terminal Xin. Concretely, the input buffer 13 generates the signal Di1 obtained by inverting the logic level of the input node Nin. The input buffer 13 which is made inactive by the high-level signal /IE outputs the low-level signal Di1 irrespective of the input signal applied to the external terminal Xin. That is, the operation state of the input buffer 13 of the I/O port I/O1 is set on the basis of the signal /IE.

As will be described later, in the case where the function of the real-time clock 10 is not used (more specifically, in the case where the real-time clock 10 is not operated), a resonance circuit Qosc is not coupled between the external terminals Xin and Xout. The amplification circuit Aosc coupled between the external terminals is in the inactive state (both of switches SW1 and SW2 are in the non-conduction state). AT this time, in the case where both of the output buffer rear-stage part 11a and the input buffer 13 in the I/O port I/O1 are in the inactive state (the I/O port I/O1 is in the inactive state), the lines X1 and X11 are in a floating state. To avoid the floating state, a signal Pup is set to the low level, and the voltage of the lines X1 and X11 is fixed to the power supply voltage VCC by the p-type transistor Mpu.

The I/O port I/O2 has the same configuration as that of the I/O port I/O1, and the output node Nout and the input node Nin (not illustrated) corresponding to the I/O port I/O1 are coupled to the external terminal Xout via the line X2. In the case where the I/O port I/O2 is in the inactive state, the line X2 is fixed to the power supply voltage VCC.

The configuration of the resonance circuit Qosc will be described. The resonance circuit Qosc has a quartz oscillator QZ and load capacitors C1 and C2 and is externally coupled to the external terminals Xin and Xout of the semiconductor device LSI. One end of the load capacitor C1 and one end of the load capacitor C2 are coupled to both sides of the quartz oscillator QZ. The other end of each of the load capacitors is coupled to the power supply line VSS. To realize lower power consumption of the resonance circuit Qosc necessary or a real-time clock, an examination of making the quartz oscillator QZ a low CL quartz oscillator is conducted. By the low CL quartz oscillator, a resonance circuit whose power consumption is largely reduced can be realized while maintaining oscillation performance by the load capacitors C1 and C2 having values smaller than those of the related-art technique. In the case of a general quartz oscillator, the value of the load capacitors C1 and C2 is around 10 pF. On the other hand, in the case of a low CL quartz oscillator, for example, low load capacitance about 3 pF can be realized.

The configuration and function of the amplification circuit Aosc will be described. The amplification circuit Aosc has an inverter (inverting amplifier circuit) 114, a resistor Rc, and the switches SW1 and SW2 and is formed in the semiconductor device LSI. The input terminal of the inverter 114 and one end of the resistor Rc are coupled to the line X1 at the node N1. The output terminal of the inverter 114 and the other end of the resistor Rc are coupled to one end of the switch SW2 and one end of the switch SW1, respectively. The other end of each of the switches SW1 and SW2 is coupled to the line X2 at the node N2.

In the case where the resonance circuit Qosc is externally attached between the external terminals Xin and Xout, both of the switches SW1 and SW2 are set to a closed state (conductive state). At this time, a quartz oscillation circuit Cosc comprised of the resonance circuit Qosc and the amplification circuit Aosc outputs a clock signal CK from the node N2 of the amplification circuit Aosc. Although not illustrated in FIG. 2, generally, a signal of the node N2 is output as the clock signal CK via a driver circuit such as an inverter.

In the case where the resonance circuit Qosc is not external attached between the external terminals Xin and Xout, both of the switches SW1 and SW2 are set to an open state (non-conduction state). The voltage at the node N2 of the amplification circuit Aosc is maintained at the power supply voltage VCC which is the same as that in the line X2 of the I/O port I/O2. Therefore, a quartz oscillation circuit Coco does not oscillate.

The open/close state of the switches SW1 and SW2 is controlled on the basis of a signal OSCE. In the case of operating the semiconductor device LSI (in the case where the real-time clock 10 is not operated) without coupling the quartz oscillator QZ between the external terminals Xin and Xout, the signal OSCE is set to the low level, and both of the switches SW1 and SW2 are set to the open state (non-conduction state). In the case of coupling the quartz oscillator QZ between the external terminals (in the case of operating the real-time clock 10), the signal OSCE is set to the high level, and both of the switches SW1 and SW2 are set to a closed state (conductive state). The level of the signal OSCD is fixed to either the low level or the high level on the basis of the operation set value which is preliminarily set in the REG 6.

Figure 3:
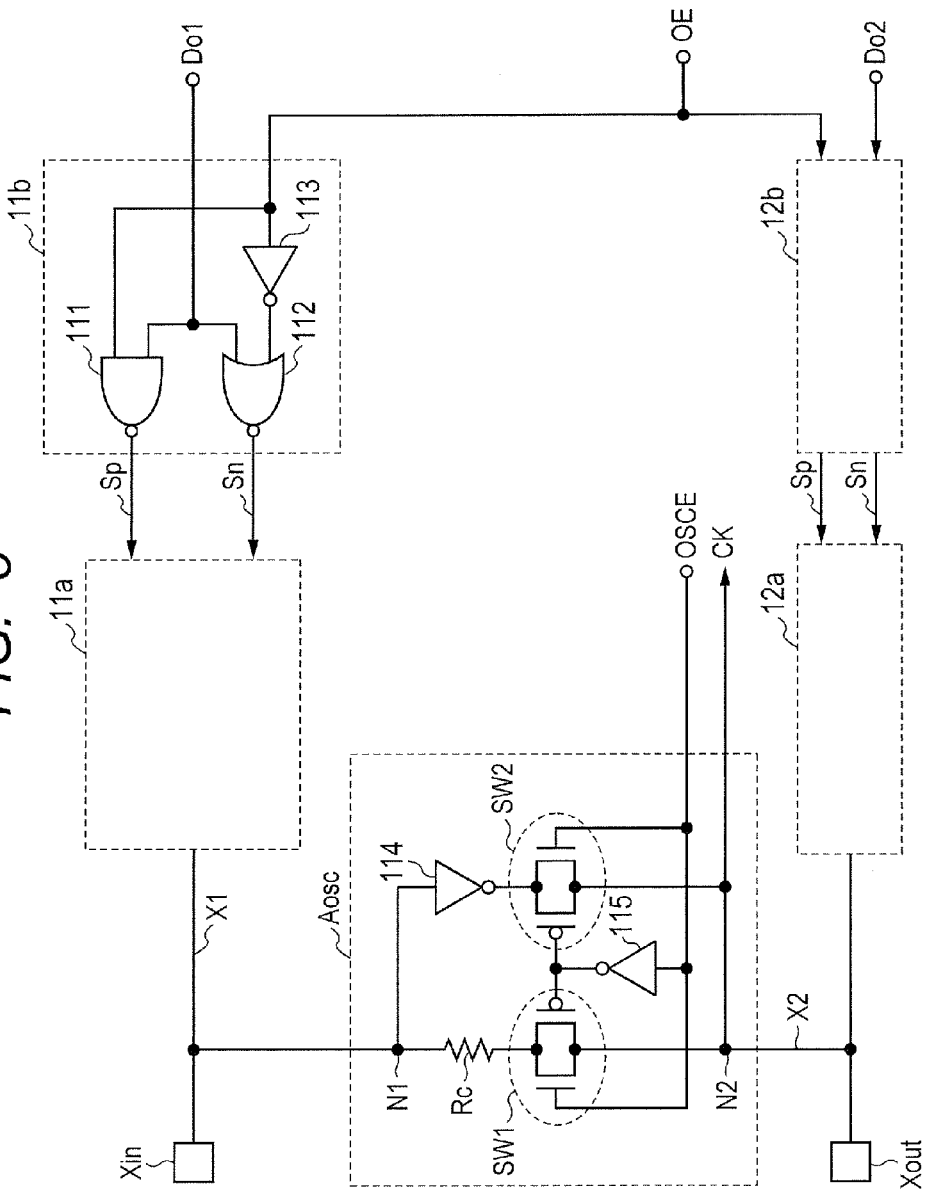
FIG. 3 is a circuit diagram of a front stage part of an output buffer and an amplification circuit in the first embodiment.

Referring now to FIG. 3, the circuit diagram of the output buffer front-stage part 11b and the amplification circuit Aosc in the first embodiment will be described.

The output buffer front-stage part 11b has an NAND circuit 111, an NOR circuit 112, and an inverter 113. The signal Do1 output from the functional block in the semiconductor device LSI of an interface circuit or the like is applied to one of the input terminals of the NAND circuit 111 and the NOR circuit 112. The signal OE and a signal obtained by inverting the logic level of the signal OE by the inverter 113 are applied to the other input terminal of the NAND circuit 111 and the other input terminal of the NOR circuit 112, respectively.

With the configuration, in the case where the signal OE is at the high level, the values of the signals Sp and Sn are determined by the signal Do1. In the case where the signal OE is at the low level, the voltages of the signals Sp and Sn are set to the high level and the low level, respectively, regardless of the signal Do1. It is assumed that the signal OE is generated by a not-illustrated circuit on the basis of the signal OSCE. When the signal OSCE is at the low level, the signal OE is also at the low level and makes the output buffer rear-stage part 11a inactive. In the case where the signal OSCE is at the high level, when I/O1 is used as an output buffer, the signal OE becomes the high level. When the I/O2 is used as an input buffer or input/output operation is not performed, the signal OE is set to the low level.

Each of the switches SW1 and SW2 in the amplification circuit Aosc is configured by a transfer gate having a CMOS configuration. The conduction states of the switches SW1 and SW2 are controlled by the signal OSCE and a signal obtained by inverting the logic level of the signal OSCE by the inverter 115, which are applied to the gate of the n-type transistor and the gate of the p-type transistor, respectively. The circuit configuration of the output buffer front-stage part 12b is the same as that of the output buffer front-stage part 11b except for the point that the signal Dot output from another function block is supplied.

Figure 4:
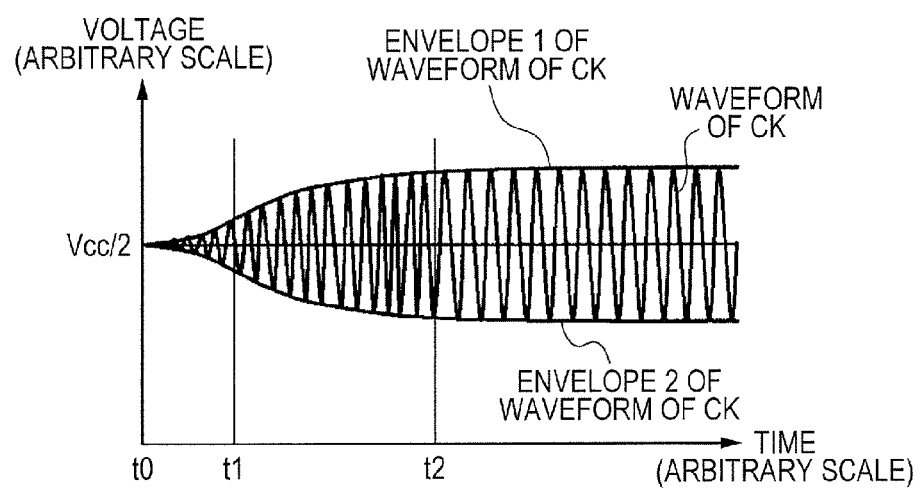
FIG. 4 is a schematic diagram illustrating clock signal waveforms when a quartz oscillation circuit in the first embodiment is activated.

With reference to FIG. 4, the waveform of the clock signal CK at the time of starting the quartz oscillation circuit Coco in the first embodiment will be described.

FIG. 4 schematically illustrates waveform changes in the clock signal CK at the time of start. When the amplification circuit Aosc is set to the active state by the signal OSCE at time t0 (refer to FIG. 2), the clock signal CK starts oscillation using an intermediate voltage VCC/2 (the input threshold voltage of the inverter 114) between the power supply voltages VCC and VSS as a reference. The intermediate voltage VCC/2 means the value which is the half of the power supply voltage VCC when the power supply voltage VSS is 0V. At time t1, the amplitude of the oscillation waveform reaches to a certain level (the period between time t0 to time t1 is set as an oscillation start period). After that, the amplitude rapidly increases. The amplitude of an oscillation waveform reaches to a predetermined value (the period between time t1 to time t2 is set as an oscillation amplification period). After the time t2, the clock signal CK maintains predetermined amplitude and frequency (the period after the time t2 is set as an oscillation stable period).

Start of the quartz oscillation circuit Cosc comprised of the resonance circuit Qosc and the amplification circuit Aosc illustrated in FIG. 2 is strongly influenced by input current of the amplification circuit Aossc in the oscillation start period. As illustrated in FIG. 2, the amplification circuit Aosc is comprised of an amplifier having an input terminal to which an output signal of the inverter 114 is fed back via the resistor Rc. When charge/discharge currents of the load capacitors C1 and C2 and, in addition, current generated by another factor flow in the resistor Rc in the oscillation start period, the bias voltage of the input signal of the inverter 114 in the oscillation start time changes. As a result, it becomes difficult to normally start oscillation of the quartz oscillation circuit Cosc.

Figure 5:
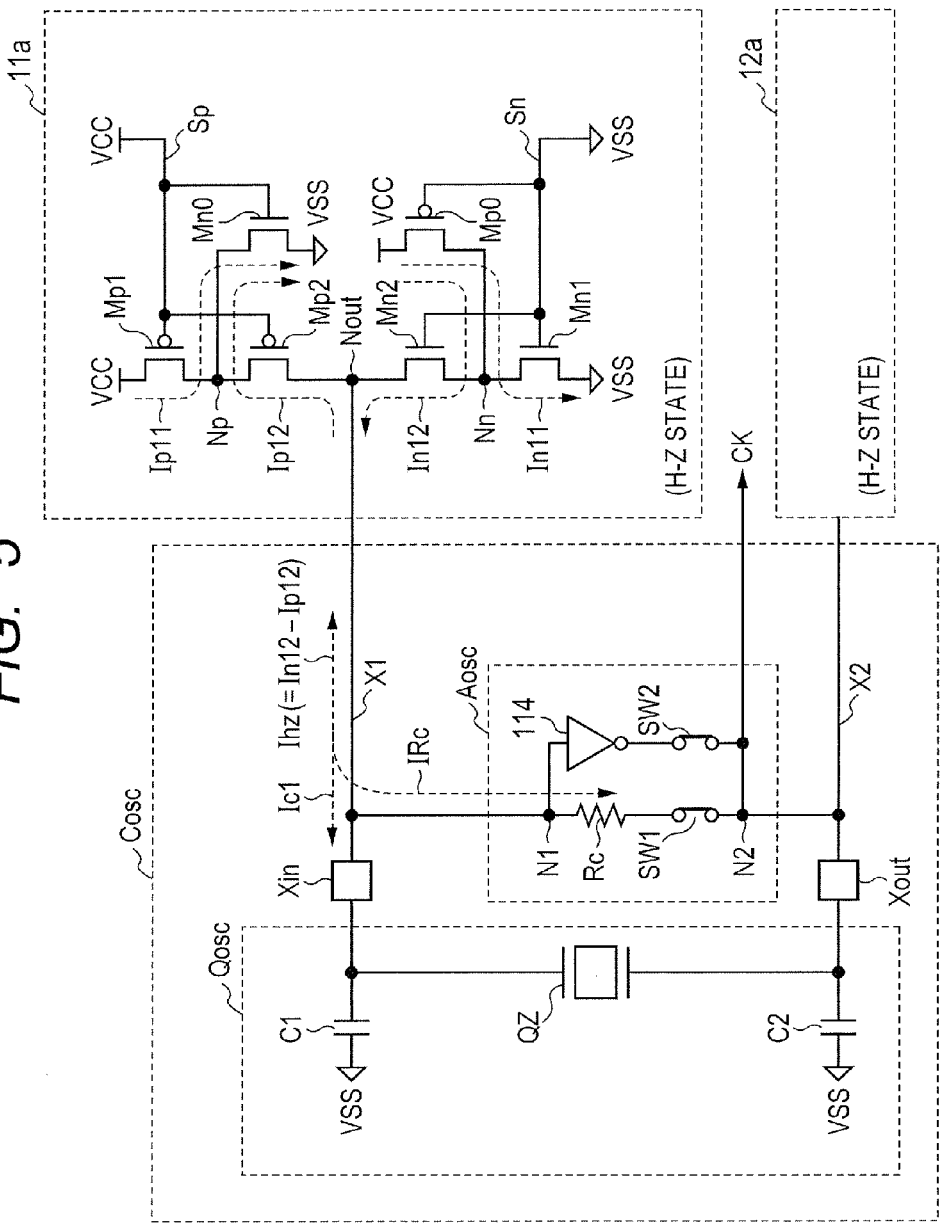
FIG. 5 is a circuit diagram illustrating operation in an inactive state of a rear stage part of the output buffer in the first embodiment.

With reference to FIG. 5, the operation in the inactive state of the output buffer rear-stage part 11a in the first embodiment will be described.

FIG. 5 illustrates flow of current in the case where the resonation circuit Qosc is externally provided between the external terminals Xin and Xout, the amplification circuit Aosc is set in the active state, and the output buffer rear-stage part 11a is set in the inactive state.

In the output buffer rear-stage part 11a which is in the inactive state, the signals Sp and Sn are set to the high level and the low level, respectively. As a result, both of the p-type transistors Mp1 and Mp2 are in the non-conduction state, and the n-type transistor Mn0 is in the conduction state. Leak current exists between the source and drain of each of the p-type transistors Mp1 and Mp2 which are in the non-conduction state, and its value depends on the voltage across the source and drain. Similarly, leak current exists also between the source and drain of each of the n-type transistors Mn1 and Mn2 which are in the non-conduction state, and its value depends on the voltage across the source and drain.

The voltage at the node N1 of the amplification circuit Aosc in the oscillation start period fluctuates in small amplitude values around the intermediate voltage VCC/2 as a center. When the voltage at the output node Nout coupled to the node N1 via the line X1 is the intermediate voltage VCC/2, the values and directions of leak currents Ip11 and Ip12 of the p-type transistors Mp1 and Mp2 depend on the voltage at the node Np. Similarly, the values and directions of leak currents In11 and In12 of the n-type transistors Mn1 and Mn2 depend on the voltage of the node Nn.

In the case where the voltage of the node Np is equal to the intermediate voltage VCC/2 as the voltage of the output node Nout, that is, the node N1, the source voltage and the drain voltage of the p-type transistor Mp2 become equal to each other, and the leak current Ip12 does not flow. On the other hand, since the drain voltage of the p-type transistor Mp1 is lower than the source voltage only by the intermediate voltage VCC/2, the leak current Ip11 flows from the power supply line VCC into the power supply line VSS via the n-type transistor Mn0.

In the case where the voltage at the node Np is lower than the intermediate voltage VCC/2, the leak current Ip11 increases. On the other hand, the leak current Ip12 generated in the p-type transistor Mp2 flows from the output node Nout to the power supply line VSS via the node Np and the n-type transistor Mn0. In the case where the voltage at the node Np is higher than the intermediate voltage VCC/2, the leak current Ip11 is divided into a component which flows in the power supply line VSS via the n-type transistor Mn0 and a component which flows to the output node Nout side via the p-type transistor Mp2.

In the case where the voltage of the node Nn is equal to the intermediate voltage VCC/2 as the voltage of the output node Nout, that is, the node N1, the source voltage and the drain voltage of the n-type transistor Mn2 become equal to each other, and the leak current Ip12 does not flow. On the other hand, since the drain voltage of the n-type transistor Mn1 is higher than the source voltage only by the intermediate voltage VCC/2, the leak current In11 flows from the power supply line VCC into the power supply line VSS via the p-type transistor Mp0.

In the case where the voltage at the node Nn is higher than the intermediate voltage VCC/2, the leak current In11 increases. On the other hand, the leak current In12 generated in the n-type transistor Mn2 flows from the power supply line VCC to the output node Nout via the p-type transistor Mp0 and the node Nn. In the case where the voltage at the node Nn is lower than the intermediate voltage VCC/2, the leak current In12 becomes a value obtained by adding the component which flows in the power supply line VSS via the n-type transistor Mn1 and the component which flows to the node Nn side via the p-type transistor Mp0.

When the leak current which flows from the output node Nout of the output buffer rear-stage part 11a in the inactive state (high-impedance state H-Z) is expressed as Ihz, the leak currents Ip12 and In12 have the following relation.

$$Ihz=In12-Ip12$$

The values of the currents are positive in the case where the leak current flows from the output node Nout and are negative in the case where the leak current flows in the output node Nout.

The leak current Ihz is branched to a current Ic1 which charges/discharges the load capacitor C1 of the resonance circuit Qosc and a current IRc flowing in the resistor Rc of the amplification circuit Aosc. Increase in the current IRc fluctuates the bias voltage of the input signal to the inverter 119 and becomes a factor which disturbs normal operation of the quartz oscillation circuit Cosc in the oscillation start period. When leak current of a transistor which is in the non-conduction state increases, the leak current Ihz increases, and the current IRc also increases. Further, when a low LC quartz oscillator is employed as the quartz oscillator QZ, the capacitance value of the load capacitors C1 and C2 largely decreases, and the current Ic1 decreases. As a result, Irc which is branched from the leak current Ihz and flows in the resistor Rc tends to further increase.

To eliminate the adverse influence of the leak current Ihz on the quartz oscillation circuit Cosc, the output buffer rear-stage part 11a in the first embodiment has the n-type transistor Mn0 and the p-type transistor Mp0 which sets the voltage at the nodes Np and Nn to the intermediate voltage VCC/2 in the inactive state. By setting the impedance (on resistance) of the n-type transistor Mn0 in the conduction state to be equal to the impedance (off resistance) of the p-type transistor Mp1 in the non-conduction state, the node Np can be set to the intermediate voltage VCC/2. Similarly, by setting the impedance (on resistance) of the p-type transistor Mp0 in the conduction state to be equal to the impedance (off resistance) of the n-type transistor Mn1 in the non-conduction state, the node Nn can be set to the intermediate voltage VCC/2.

By setting the node Np to the intermediate voltage VCC/2, the source voltage and the drain voltage of the p-type transistor Mp2 become equal to each other. Similarly, by setting the node Nn to the intermediate voltage VCC/2, the source voltage and the drain voltage of the n-type transistor Mn2 become equal to each other. As a result, outflow from the output node Nout of leak current due to the p-type transistors Mp1 and Mp2 and the n-type transistors Mn1 and Mn2 or inflow to the output node Nout are suppressed to the minimum. As described above, by setting the nodes Np and Nn to the intermediate voltage VCC/2, the amplification circuit Aosc in the oscillation start time normally operates, and the quartz oscillation circuit Cosc normally generates the clock signal CK.

Since the off resistance of the p-type transistor Mp1 is high resistance, the on resistance of the n-type transistor Mn0 has to be accordingly increased. Concretely, the ratio (Ln0/Wn0) of gate length (Ln0) to gate width (Wn0) of the n-type transistor Mn0 is set to be higher than the ratio (Lp1/Wp1) of gate length (Lp1) to gate width (Wp1) of the p-type transistor Mp1. Similarly, the ratio (Lp0/Wp0) of gate length (Lp0) to gate width (Wp0) of the p-type transistor Mp0 is set to be higher than the ratio (Ln1/Wn1) of gate length (Ln1) to gate width (Wn1) of the n-type transistor Mn1.

The reason why the voltages at the nodes Np and Nn are set to the intermediate voltage VCC/2 is to set them to the same as the input threshold voltage of the inverter 114 (CMOS circuit configuration) of the amplification circuit Aosc. Therefore, in the case where the input threshold voltage of the amplification circuit Aosc is different from the intermediate voltage VCC/2, desirably, the set voltages of the nodes Np and Nn are properly set to the same as the input threshold voltage. In the range where the adverse influence of the leak current Ihz onto the quartz oscillation circuit Cosc is suppressed, the voltages at the nodes Np and Nn may be set to voltages around the intermediate voltage VCC/2. That is, the voltages of the nodes Np and Nn may be set to substantially the same as the input threshold voltage of the amplification circuit Aosc.

Means of setting the voltages at the nodes Np and Nn as the intermediate voltage VCC/2 is not limited to the n-type transistor Mn0 and the p-type transistor Mp0. By forming different electric paths in the n-type transistors Mn1 and Mn2 between the node Np and the power supply line VSS and forming different electric paths in the p-type transistors Mp1 and Mp2 between the node Nn and the power supply line VCC, the voltages at the nodes Np and Nn can be set to the intermediate voltage VCC/2.

Modification of First Embodiment

Figure 6:
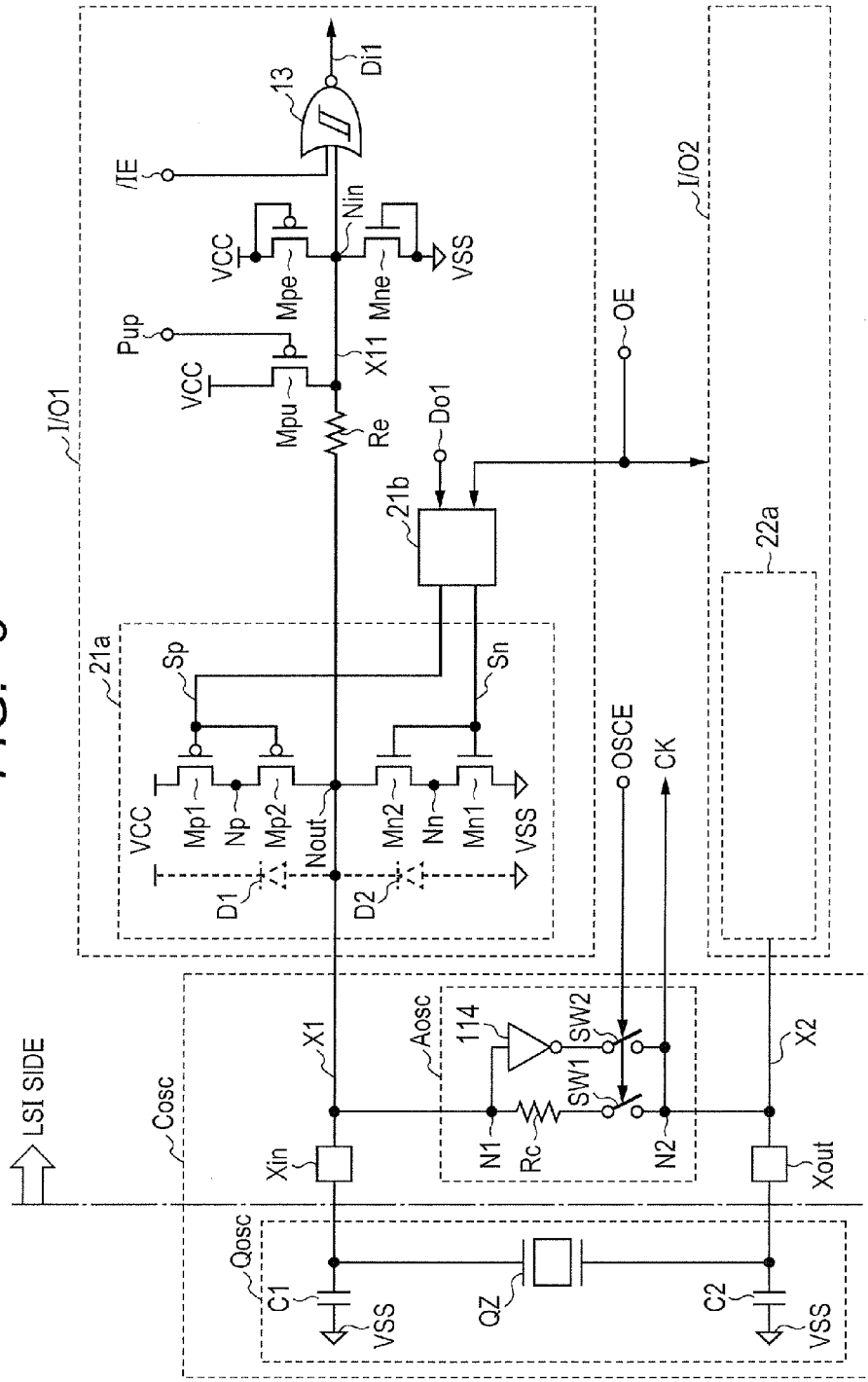
FIG. 6 is a circuit diagram of an I/O port and its peripheral circuits as a modification of the first embodiment.

With reference to FIG. 6, a circuit diagram of the I/O port I/O1 and its peripheral circuits in a modification of the first embodiment will be described.

The different point between FIGS. 6 and 2 is a circuit configuration of an output buffer rear-stage part 21a and the output buffer rear-stage part 11a. The output buffer rear-stage part 21a has a configuration obtained by eliminating the n-type transistor Mn0 and the p-type transistor Mp0 in the output buffer rear-stage part 11a illustrated in FIG. 2. The other configuration is the same and, in the output buffer rear-stage parts, the same reference numerals are designated to corresponding circuit elements. The configuration and function of the output buffer front-stage part 21b of FIG. 6 are the same as those of the output buffer front-stage part 11b illustrated in FIG. 2.

The output buffer rear-stage part 21a has the p-type transistors Mp1 and Mp2 for increasing the output node Nout to the high level. The source and drain of the p-type transistor Mp1 are coupled to the power supply line VCC and the node Np, respectively. The source and drain of the p-type transistor Mp2 are coupled to the node Np and the output node Nout, respectively. The signal Sp output from the output buffer front-stage part 21b is applied to the gate each of the p-type transistors Mp1 and Mp2. When the signal Sp becomes the low level, both of the p-type transistors Mp1 and Mp2 become a conductive state, and the output of the output node Nout is increased to the power supply voltage VCC.

The output buffer rear-stage part 21a also has the n-type transistors Mn1 and Mp2. The drain and source of the n-type transistor Mn1 are coupled to the node Nn and the power supply line VSS, respectively. The drain and source of the n-type transistor Mn2 are coupled to the output node Nout the node Nn, respectively. The signal Sn output from the output buffer front-stage part 21b is applied to the gate of each of the n-type transistors Mn1 and Mn2. When the signal Sn becomes the high level, both of the n-type transistors Mn1 and Mn2 become a conductive state, and the voltage at the output node Nout is decreased to the power supply voltage VSS.

Figure 7:
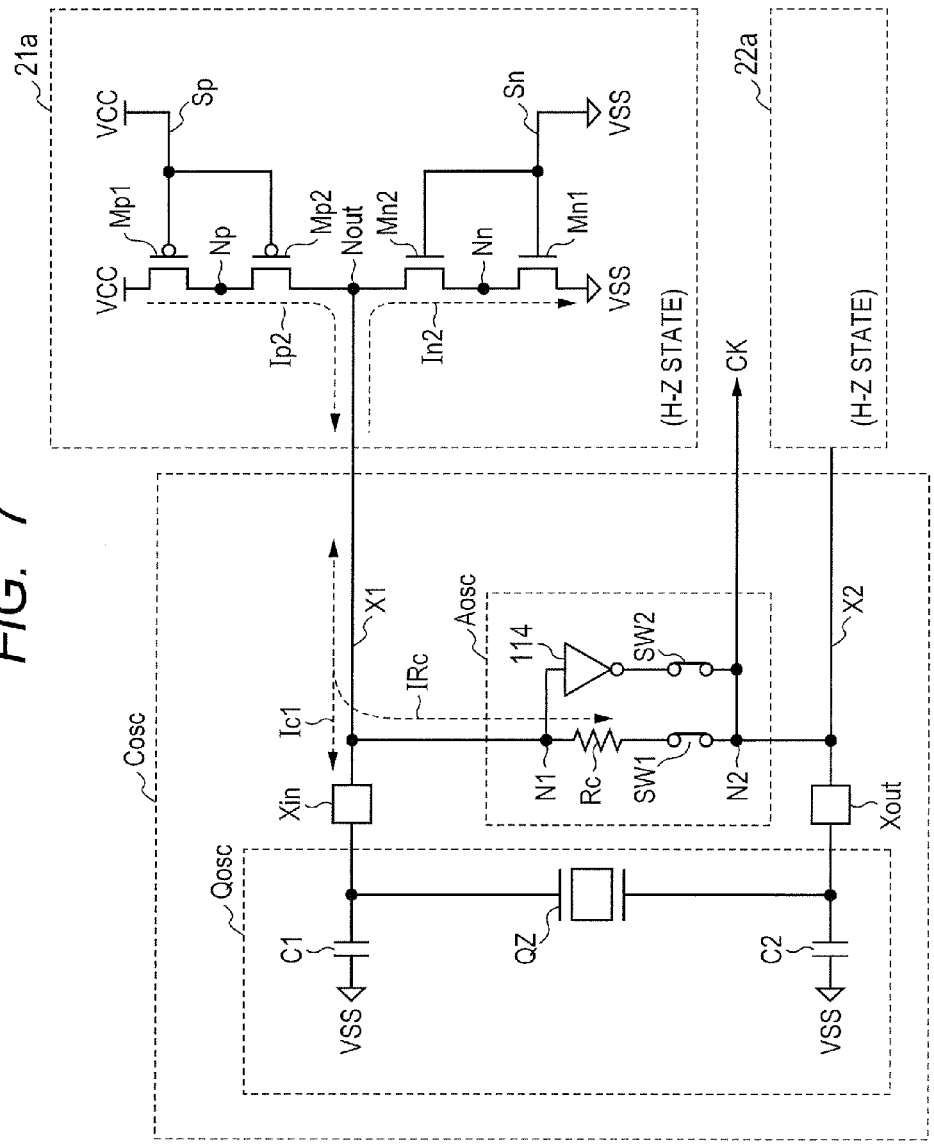
FIG. 7 is a circuit diagram illustrating the operation in an inactive state of the rear stage part of the output buffer in the modification of the first embodiment.

With reference to FIG. 7, the operation in the inactive state of the output buffer rear-stage part 21a in the modification of the first embodiment.

FIG. 7 illustrates the flow of current in the case where the resonance circuit Qosc is externally provided between the external terminals Xin and Xout, the amplification circuit Aosc is set to the active state, and the output buffer rear-stage part 21a is set in the inactive state.

In the output buffer rear-stage part 21a in the inactive state, the signals Sp and Sn are set to the high level and the low level, respectively. As a result, all of the p-type transistors Mp1 and Mp2 are in the non-conduction state. Leak current exists between the source and drain in each of the p-type transistors Mp1 and Mp2 which are in the non-conduction state, and the value depends on the voltage across the source and drain. Similarly, leak current exists also between the source and drain of each of the n-type transistors Mn1 and Mn2 which are in the non-conduction state, and the value depends on the voltage across the source and drain.

When the voltage at the node N1 of the amplification circuit Aosc at the oscillation start time is set to the intermediate voltage VCC/2, the leak current Ip2 flows from the output node Nout. The value of the leak current Ip2 depends on a value obtained by coupling the off resistances of the p-type transistors Mp1 and Mp2 in series. Similarly, the leak current In2 flows in the output node Nout. The value of the leak current In2 depends on a value obtained by coupling the off resistances of the n-type transistors Mn1 and Mn2 in series. The leak current Ip2 is split to the current Ic1 which charges the load capacitor C1 of the resonance circuit Qosc and the current IRc which flows in the resistor Rc of the amplification circuit Aosc.

The values of the leak current of the p-type transistors Mp1 and Mp2 and the n-type transistors Mn1 and Mn2 which are in the non-conduction state depend on the voltage across the source and drain of each of the transistors. For example, in the case where the gate width and gate length of the p-type transistors Mp1 and Mp2 are the same, a voltage VCC/4 which is a quarter of the power supply voltage VCC is applied. Similarly, in the case where the gate width and gate length of the n-type transistors Mn1 and Mn2 are the same, the voltage VCC/4 is applied also across the source and drain of each of the transistors.

In an output buffer circuit having a general CMOS configuration, one p-type transistor is coupled between the power supply line VCC and an output terminal, and one n-type transistor is coupled between the output terminal and the power supply line VSS. In the case of replacing the output buffer rear-stage part 21a of FIG. 7 with an output buffer circuit having a general CMOS configuration, the intermediate voltage VCC/2 is applied across the source and drain of each of the transistors which are in the non-conduction state. As a result, the leak currents Ip2 and In2 in the general CMOS configuration increase to about twice as much as each of the leak currents in the configuration of the output buffer rear-stage part 21a.

As described above, the leak currents Ip2 and In2 become factors which fluctuate the bias voltage of the input signal to the amplification circuit Aosc and disturb the normal operation of the quartz oscillation circuit Cosc in the oscillation start time. Particularly, in the case where the oscillation characteristic of the amplification circuit Aosc largely fluctuates with respect to a change in the bias voltage of the input signal, by reducing the leak currents Ip2 and In2 to the half of that of the output buffer circuit having the CMOS configuration, the normal operation of the quartz oscillation circuit Cosc can be realized more reliably.

In the first embodiment and its modification, both of the external terminals Xin and Xout coupled to the resonance circuit Qoco can be used also as external terminals of the I/O port. Alternatively, any one of the external terminals Xin and Xout may be also used as the terminal of the I/O port. In the case where the external terminal Xout is the terminal which is not used for the I/O port, the I/O port I/O2 becomes unnecessary, and the external terminal Xout becomes a terminal dedicated to the quartz oscillation circuit Coco. On the contrary, in the case where the external terminal Xin is a terminal which is not used for the I/O port, the I/O port I/O1 becomes unnecessary, and the external terminal Xin becomes a terminal dedicated to the quartz oscillation circuit Coco.

It is to be noted that the embodiments disclosed herein are illustrative and not restrictive in all aspects. The scope of the present invention is defined by the scope of claims rather than by the description, and all changes that fall within the claims or equivalence are intended to be included.

What is claimed is:

1. A semiconductor device comprising:
   a first terminal;
   an amplification circuit coupled to the first terminal; and
   an output buffer whose output terminal is coupled to the first terminal,
   wherein the output buffer has a first transistor of a first conduction type whose source and drain are coupled to a first power supply line and a first node, respectively, and a second transistor of the first conduction type whose source and drain are coupled to the first node and the output terminal, respectively, and
   wherein the conduction states of the first and second transistors are controlled in response to a first control signal which is applied commonly to the gate of each of the first and second transistors.

2. The semiconductor device according to claim 1, wherein the output buffer further comprises a third transistor of a second conduction type whose drain and source are coupled to the first node and a second power supply line, respectively, and having a gate to which the first control signal is applied.

3. The semiconductor device according to claim 2, wherein the ratio of gate length to gate width of the third transistor is higher than that of gate length to gate width of the first transistor.

4. The semiconductor device according to claim 3, wherein the conduction states of the first and second transistor and that of the third transistor change in a complementary manner in response to the first control signal.

5. The semiconductor device according to claim 4, wherein current between the source and the drain of the second transistor which is in the non-conduction state is smaller than current between the source and the drain of the first transistor which is in the non-conduction state.

6. The semiconductor device according to claim 4, wherein source voltage and drain voltage of the second transistor which is in the non-conduction state are equal to each other.

7. The semiconductor device according to claim 2,
wherein the output terminal is coupled to an input terminal of the amplification circuit, and
wherein in the case where the second transistor is in the non-conduction state, voltage at the first node is substantially the same as an input threshold voltage of the amplification circuit.

8. The semiconductor device according to claim 7, wherein the input threshold voltage is intermediate voltage between voltage of the first power supply line and voltage of the second power supply line.

9. A semiconductor device comprising:
a first terminal;
a second terminal;
an amplifier coupled between the first and second terminals and, in the case where a resonance circuit is coupled to the first and second terminals, configuring an oscillation circuit together with the resonance circuit; and
a first output buffer coupled to the first terminal and outputting an input signal to the first terminal,
wherein the first output buffer has a first p-type transistor whose source is coupled to a first power supply line for supplying power supply voltage, a second p-type transistor whose source is coupled to drain of the first p-type transistor and whose drain is coupled to the first terminal, a first n-type transistor whose source is coupled to a second power supply line which supplies ground voltage, and a second n-type transistor whose source is coupled to the drain of the first n-type transistor and whose drain is coupled to the first terminal.

10. The semiconductor device according to claim 9, wherein the first output buffer further includes a first electric path different from the first and second n-type transistors formed between the drain of the first p-type transistor and the second power supply line, and a second electric path different from the first and second p-type transistors formed between the drain of the first n-type transistor and the first power supply line.

11. The semiconductor device according to claim 10, wherein the first electric path is realized by a third n-type transistor whose drain is coupled to the drain of the first p-type transistor and whose source is coupled to the second power supply line, and the second electric path is realized by a third p-type transistor whose drain is coupled to the drain of the first n-type transistor and whose source is coupled to the first power supply line.

12. The semiconductor device according to claim 9, further comprising a second output buffer coupled to the second terminal and outputting an input signal to the second terminal,
wherein the second output buffer includes a third p-type transistor coupled to the first power supply line, a fourth p-type transistor whose source is coupled to the drain of the third p-type transistor and whose drain is coupled to the second terminal, a third n-type transistor whose source is coupled to the second power supply line, and a fourth n-type transistor whose source is coupled to the drain of the third n-type transistor and whose drain is coupled to the second terminal.

13. The semiconductor device according to claim 12,
wherein the first output buffer further comprises a first electric path different from the first and second n-type transistors formed between the drain of the first p-type transistor and the second power supply line, and a second electric path different from the first and second p-type transistors formed between the drain of the first n-type transistor and the first power supply line, and
wherein the second output buffer further comprises a third electric path different from the third and fourth n-type transistors formed between the drain of the third p-type transistor and the second power supply line, and a fourth electric path different from the third and fourth p-type transistors formed between the drain of the third n-type transistor and the first power supply line.

14. The semiconductor device according to claim 13,
wherein the first electric path is realized by a fifth n-type transistor whose drain is coupled to the drain of the first p-type transistor and whose source is coupled to the second power supply line,
wherein the second electric path is realized by a fifth p-type transistor whose drain is coupled to the drain of the first n-type transistor and whose source is coupled to the first power supply line,
wherein the third electric path is realized by a sixth n-type transistor whose drain is coupled to the drain of the third p-type transistor and whose source is coupled to the second power supply line, and
wherein the fourth electric path is realized by a sixth p-type transistor whose drain is coupled to the drain of the third n-type transistor and whose source is coupled to the first power supply line.

* * * * *